US009971523B2

(12) United States Patent
Kodama et al.

(10) Patent No.: US 9,971,523 B2
(45) Date of Patent: May 15, 2018

(54) MEMORY CONTROLLER WITH DATA COMPRESSION AND PADDING FEATURES, METHOD OF CONTROLLING NONVOLATILE MEMORY AND MEMORY SYSTEM

(71) Applicant: Toshiba Memory Corporation, Minato-ku, Tokyo (JP)

(72) Inventors: Sho Kodama, Kawasaki Kanagawa (JP); Keiri Nakanishi, Kawasaki Kanagawa (JP); Kohei Oikawa, Tokyo (JP); Kojiro Suzuki, Tokyo (JP)

(73) Assignee: Toshiba Memory Corporation, Tokyo (JP)

( * ) Notice: Subject to any disclaimer, the term of this patent is extended or adjusted under 35 U.S.C. 154(b) by 0 days. days.

(21) Appl. No.: 15/260,963

(22) Filed: Sep. 9, 2016

(65) Prior Publication Data
US 2017/0262194 A1    Sep. 14, 2017

Related U.S. Application Data

(60) Provisional application No. 62/306,397, filed on Mar. 10, 2016.

(51) Int. Cl.
*G06F 3/06* (2006.01)
*G06F 11/10* (2006.01)
*G11C 29/52* (2006.01)

(52) U.S. Cl.
CPC ............ *G06F 3/0616* (2013.01); *G06F 3/064* (2013.01); *G06F 3/0656* (2013.01); *G06F 3/0659* (2013.01); *G06F 3/0665* (2013.01); *G06F 3/0679* (2013.01); *G06F 11/1068* (2013.01); *G11C 29/52* (2013.01)

(58) Field of Classification Search
CPC ...... G06F 3/0616; G06F 3/064; G06F 3/0656; G06F 3/0665; G06F 3/0679; G06F 11/1068; G06F 3/0659; G11C 29/52
See application file for complete search history.

(56) References Cited

U.S. PATENT DOCUMENTS

| 8,347,023 B2 | 1/2013 | Yang |
| 8,954,828 B2 | 2/2015 | Torii et al. |
| 9,105,305 B2 | 8/2015 | Werner et al. |
| 2010/0088464 A1* | 4/2010 | Yang .................. G06F 12/0246 711/103 |
| 2011/0320915 A1* | 12/2011 | Khan .................. G06F 3/0608 714/773 |

(Continued)

FOREIGN PATENT DOCUMENTS

| JP | 2013-225830 A | 10/2013 |
| JP | 2013-545202 A | 12/2013 |
| WO | 2014/184941 A1 | 11/2014 |

*Primary Examiner* — Ajay Ojha
(74) *Attorney, Agent, or Firm* — White & Case LLP

(57) ABSTRACT

According to one embodiment, a memory controller includes a compression unit and a padding processing unit. The compression unit compresses first data to be written into a first page and second data to be written into a second page. The padding processing unit performs a padding processing such that the compressed first data is written into first memory cells, first padding data is written into second memory cells, the compressed second data is written into third memory cells, and second padding data is written into fourth memory cells.

17 Claims, 14 Drawing Sheets

(56) References Cited

U.S. PATENT DOCUMENTS

2014/0101514 A1\* 4/2014 Cho ................... G06F 11/1012
 714/758
2016/0011938 A1\* 1/2016 Koseki ................... G06F 12/04
 714/766

\* cited by examiner

| Page | DATA | | | |
|---|---|---|---|---|
| Upper | 1 | 0 | 0 | 1 |
| Lower | 1 | 1 | 0 | 0 |

| NAND PAGE ADDRESS | WriteCount | CompressionFlag Cpflag |
|---|---|---|
| PAGE ADDRESS N | | 1 |
| ⋮ | ⋮ | ⋮ |
| PAGE ADDRESS M | | 0 |

MEMORY CONTROLLER WITH DATA COMPRESSION AND PADDING FEATURES, METHOD OF CONTROLLING NONVOLATILE MEMORY AND MEMORY SYSTEM

CROSS-REFERENCE TO RELATED APPLICATIONS

This application is based upon and claims the benefit of priority from U.S. Provisional Application No. 62/306,397, filed on Mar. 10, 2016; the entire contents of which are incorporated herein by reference.

FIELD

Embodiments described herein relate generally to a memory controller controlling a nonvolatile memory, a method of controlling a nonvolatile memory, and a memory system.

BACKGROUND

The flash memories have a characteristic in that the durability thereof is degraded as the amount of electric charge injected to memory cells increases.

DETAILED DESCRIPTION

In general, according to one embodiment, a memory controller controls a nonvolatile memory. The nonvolatile memory includes a plurality of physical sectors. Each of the physical sectors includes memory cells. Each of the memory cells is capable of storing data of m bits using threshold voltage distributions of the m-th power of two. Each of the physical sectors stores data of m pages. Here, m is a natural number of two or more. The memory controller includes a compression unit, a padding processing unit, and an output unit. The compression unit compresses first data to be written into a first page and second data to be written into a second page. Each of the first page and the second page is one of the m pages allocated to a first physical sector. The padding processing unit performs a first padding processing and a second padding processing. The first padding processing generates first recording data such that the compressed first data is written into first memory cells, and first padding data is written into second memory cells. The first memory cells are memory cells arrayed from a first cell position of the first physical sector in a first direction so as to be wrappable around. The second memory cells are memory cells excluding the first memory cells among the memory cells included in the first physical sector. The second padding processing generates second recording data such that the compressed second data is written into third memory cells, and second padding data is written into fourth memory cells. The third memory cells are a plurality of memory cells arrayed from a second cell position of the first physical sector in a second direction so as to be wrappable around. The fourth memory cells are memory cells excluding the third memory cells among the memory cells included in the first physical sector. The output unit writes the first recording data into the first page and writes the second recording data into the second page.

Hereinafter, exemplary embodiments of a memory controller, a method of controlling a nonvolatile memory, and a memory system will be described in detail with reference to the accompanying drawings. The present invention is not limited to the following embodiments.

First Embodiment

Figure 1:
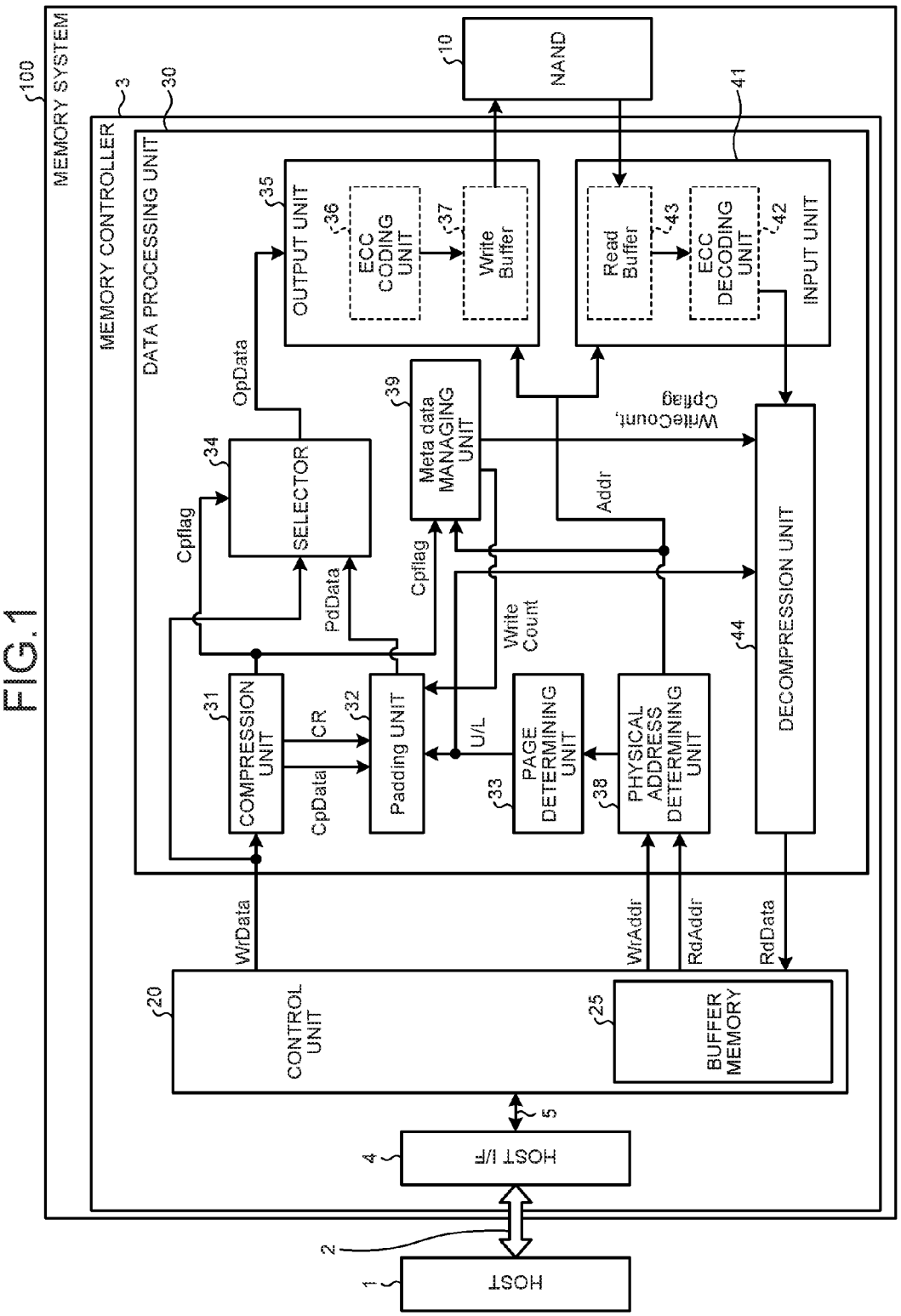
FIG. 1 is a functional block diagram that illustrates an example of the internal configuration of a memory system according to a first embodiment.

FIG. 1 is a block diagram that illustrates an example of the configuration of a memory system 100 according to a first embodiment. The memory system 100 is connected to a host apparatus 1 (hereinafter, abbreviated as a host) through a communication line 2 and functions as an external storage device of the host 1. The host 1, for example, may be an information processing apparatus such as a personal computer, a mobile phone, an imaging apparatus, or a mobile terminal such as a tablet computer or a smart phone.

The memory system 100 includes: a NAND flash memory (hereinafter, abbreviated as a NAND) 10 as a nonvolatile memory; and a memory controller 3. The nonvolatile memory is not limited to the NAND flash memory but may be a flash memory having a three-dimensional structure, a resistance random access memory (ReRAM), a ferroelectric random access memory (FeRAM), or the like.

The NAND 10 includes one or more memory chips each including a memory cell array. The memory cell array includes a plurality of cells arranged in a matrix pattern. The memory cell array includes a plurality of blocks that are units for data erasing. Each block is configured by a plurality of physical sectors MS (see FIG. 2). The memory cell array is not particularly limited to a specific configuration but may be a memory cell array having a two-dimensional structure as illustrated in FIG. 2, a memory cell array having a three-dimensional structure, or a memory cell array having any other structure.

Figure 2:
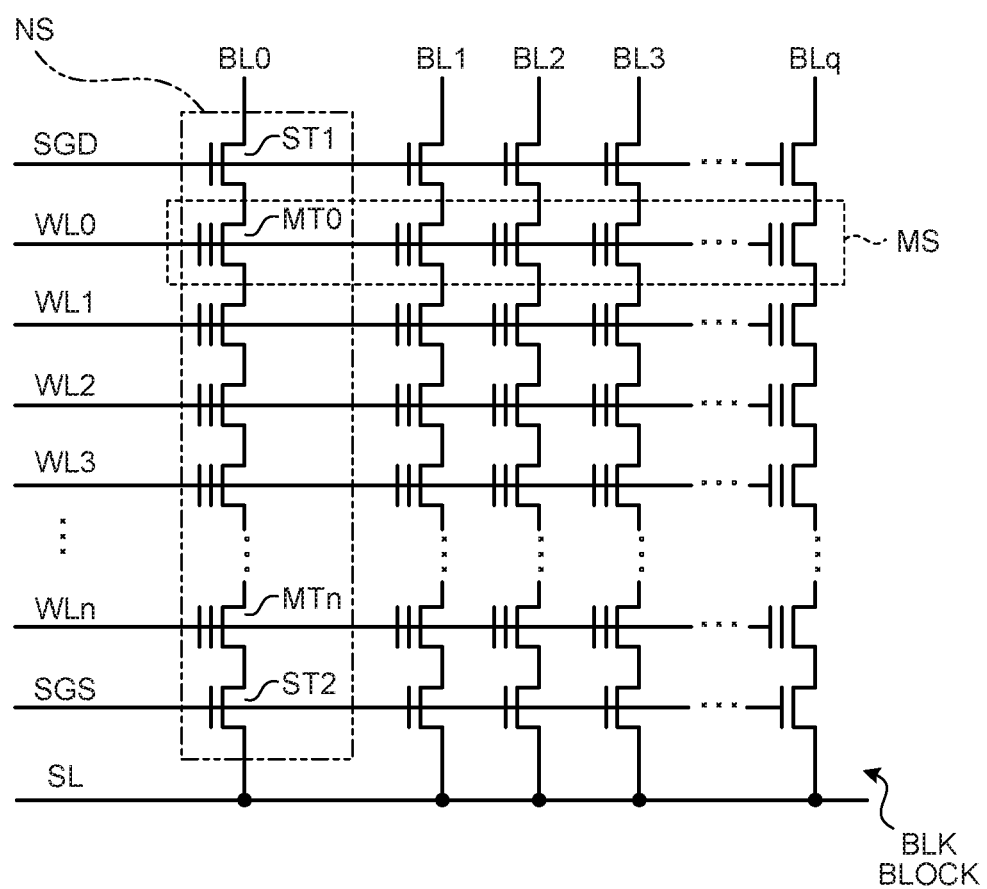
FIG. 2 is a diagram that illustrates an example of the circuit configuration of a memory cell array.

FIG. 2 is a diagram that illustrates an example of the configuration of a block of the memory cell array having a two-dimensional structure. FIG. 2 illustrates one of a plurality of blocks that configure the memory cell array having the two-dimensional structure. The other blocks have the same configuration as that illustrated in FIG. 2. The block BLK of the memory cell array includes (q+1) (here, q is an integer equal to or more than zero) NAND strings NS. Each NAND string NS includes: (n+1) (here, n is an integer equal to or more than zero) cell transistors MT0 to MTn connected in series to share a diffusion area (a source region or a drain region) between cell transistors MT adjacent to each other; and selection transistors ST1 and ST2 arranged at both ends of the column of the cell transistors MT0 to MTn.

Word lines WL0 to WLn are respectively connected to control gate electrodes of the cell transistors MT0 to MTn. In addition, cell transistors MTi (here, i=0 to n) are connected to be common using the same word line WLi (here, i=0 to n). In other words, the control gate electrodes of the cell transistors MTi disposed in the same row within the block BLK are connected to the same word line WLi.

Each of the cell transistors MT0 to MTn is configured by a field effect transistor having a stacked gate structure formed on a semiconductor substrate. Here, the stacked gate structure includes: a charge storage layer (floating gate electrode) formed on the semiconductor substrate with a gate insulating film being interposed therebetween; and a control gate electrode formed on the charge storage layer with an inter-gate insulating film being interposed therebetween. A threshold voltage of each of the cell transistors MT0 to MTn changes according to the number of electrons to be stored in the floating gate electrode and thus, can store data according to a difference in the threshold voltage.

Bit lines BL0 to BLq are respectively connected to the drains of (q+1) selection transistors ST1 within one block BLK, and a selection gate line SGD is connected to be common to the gates of the selection transistors. In addition, the source of the selection transistor ST1 is connected to the drain of the cell transistor MT0. Similarly, a source line SL is connected to be common to the sources of the (q+1) selection transistors ST2 within one block BLK, and a selection gate line SGS is connected to be common to the gates of the selection transistors. In addition, the drain of the selection transistor ST2 is connected to the source of the cell transistor MTn.

Each cell is connected not only to the word line but also to the bit line. Each cell can be identified by using an address used for identifying a word line and an address used for identifying a bit line. The data of cells (the cell transistors MT) disposed within the same block BLK is erased altogether. On the other hand, data is written and read in units of physical sectors MS. One physical sector MS includes a plurality of cells, which are connected to one word line, arrayed in a line.

Each cell can perform multi-value (m bits) storage. In a case where the cells are operated in a single level cell (SLC) mode, one physical sector MS corresponds to one page. In a case where the cells are operated in a multiple level cell (MLC) mode, one physical sector MS corresponds to two pages. In addition, in a case where the cells are operated in a triple level cell (TLC) mode, one physical sector MS corresponds to three pages. In a case where the cells are operated in a quadruple level cell (QLC) mode, one physical sector MS corresponds to four pages.

In a read operation and a program operation, one-word line is selected and one physical sector MS is selected according to the physical address. A switching of a page within the physical sector MS is performed using the physical address.

In the NAND 10, user data transmitted from the host 1, management information used for managing the user data, and the like are stored. The management information includes a logical/physical translation table and the like.

The memory controller 3 includes: a host interface 4; a control unit 20; and a data processing unit 30. The host I/F 4 performs a processing according to an interface standard for the host 1 and outputs a command, user data (write data), and the like received from the host 1 to an internal bus 5. In addition, the host I/F 4 transmits user data read from the NAND 10, a response from the control unit 20, and the like to the host 1.

The control unit 20 functions as a main control unit of the memory controller 3. The control unit 20 includes a buffer memory 25. The function of the control unit 20 is realized by one or a plurality of CPUs (processors) executing firmware loaded into the buffer memory 25 and peripheral circuits.

The buffer memory 25 is a semiconductor memory that can be accessed at a speed higher than the NAND 10. The buffer memory 25, for example, is a volatile memory, and a static random access memory (SRAM) or a dynamic random access memory (DRAM) is used. The buffer memory 25 includes storage areas as a write data buffer, a read data buffer, and a metadata buffer. Data received from the host 1 is temporarily stored in the write buffer before being written into the NAND 10. In addition, data read from the NAND 10 is temporarily stored in the read data buffer before being transmitted to the host 1. The above-described management information stored in the NAND 10 is loaded into the metadata buffer. The management information loaded in the metadata buffer is backed up into the NAND 10.

The control unit 20 performs a processing corresponding to a command received from the host 1. For example, when a write request is received, the control unit 20 temporarily stores write data in the buffer memory 25. The write request described above includes a write command, a write address WrAddr, and write data WrData. The control unit 20 reads the write data WrData stored in the buffer memory 25 and outputs the read write data WrData to the data processing unit 30. In addition, the control unit 20 outputs a write address WrAddr corresponding to the write data WrData to the data processing unit 30.

On the other hand, in a case where a read request is received, the control unit 20 outputs a read address RdAddr designated by the read request to the data processing unit 30.

The control unit 20 manages user data by using a logical/physical translation table that is one kind of the management information loaded into the buffer memory 25. In the logical/ physical translation table, mapping associating a logical address WrAddr that can be designated by the host 1 and a physical address Addr of the NAND 10 with each other is registered. For example, logical block addressing (LBA) is used as the logical address. The physical address Addr represents a storage position on the NAND 10 at which data is stored.

The control unit 20 performs management of blocks included in the NAND 10 by using a block management table that is one kind of the management information described above. The block management table, for example, manages the following block management information.

A number of times of erasing in units of blocks (erase count)

Information used for identifying whether a block is an active block or a free block Block address of a bad block In an active block, valid data is recorded. In a free block, valid data is not recorded. The free block can be reused as an erased block after erasing data thereof. The valid data is data associated with a logical address, and invalid data is data with which a logical address is not associated. When data is written into an erased block, the erased block becomes the active block. A bad block is an unusable block that does not normally operate due to various factors.

The data processing unit 30 includes: a compression unit 31; a padding unit 32; a page determining unit 33; a selector 34; an output unit 35; a physical address determining unit 38; a metadata managing unit 39; an input unit 41; and a decompression unit 44. The compression unit 31, the padding unit 32, the selector 34, and the output unit 35 configure a write processing unit that performs data writing to the NAND 10. The input unit 41 and the decompression unit 44 configure a read processing unit that performs reading data from the NAND 10. The function of each element configuring the data processing unit 30 is realized by a CPU executing firmware and/or hardware.

Figures 3, 4:
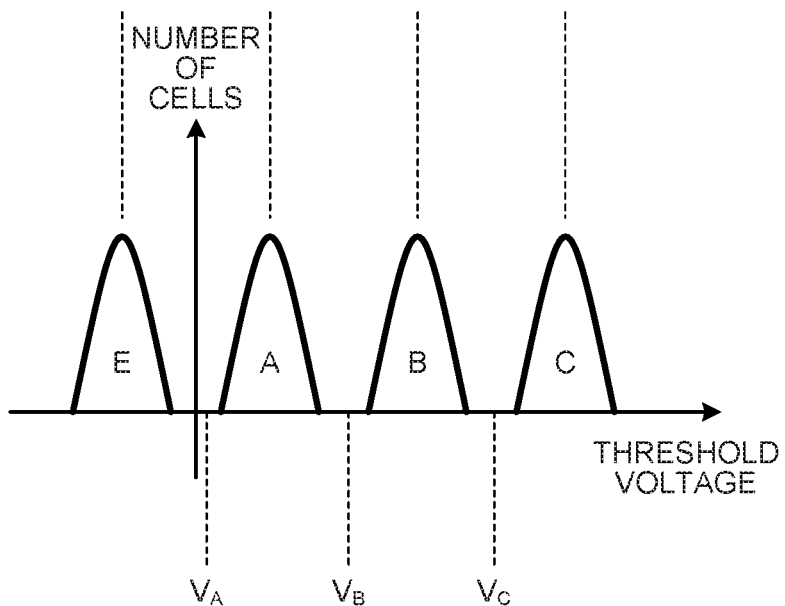
FIG. 3 is a diagram that illustrates an example of threshold voltage distributions and data coding of memory cells of two bits/cell.
FIG. 4 is a diagram that illustrates an example of a management table storing metadata.

FIG. 3 is a diagram that illustrates an example of threshold voltage distributions and data coding of memory cells of two bits/cell operating in the MLC mode. In a lower diagram illustrated in FIG. 3, the horizontal axis represents the threshold voltage, and the vertical axis represents the number of cells. In the case of memory cells of two bits/cell, four distributions formed by a distribution E, a distribution A, a distribution B, and a distribution C are included. The distribution E has a lowest threshold voltage and corresponds to a threshold voltage distribution of an erased state. The threshold voltage is higher in order of the distributions A, B, and C. Thus, the distribution C has a maximum threshold voltage. Data values of two bits are associated with the threshold voltage distributions E, A, B, and C. Such association is called data coding. The data coding is set in advance. At the time of writing (programming) data, electric charge is injected into cells such that a threshold voltage distribution corresponding to a stored data value is formed in accordance with data coding. One physical sector corresponds to two pages. In this embodiment, these two pages will be referred to as a lower page and an upper page.

In FIG. 3, an upper diagram is a diagram that illustrates an example of data coding. The distribution E corresponds to a data value of "11", the distribution A corresponds to a data value of "01", the distribution B corresponds to a data value of "00", and the distribution C corresponds to a data value of "10". In this embodiment, when data of the upper page is denoted by Du, and data of the lower page is denoted by Dl, the data value of two bits will be denoted as "DuDl". The data coding is not limited to the example illustrated in FIG. 3. A reading voltage VA is set between the distribution E and the distribution A, a reading voltage VB is set between the distribution A and the distribution B, and a reading voltage VC is set between the distribution B and the distribution C. Here, VB is a reading voltage used for determining the data value of the lower page, and VA and VC are reading voltages used for determining the data value of the upper page.

A flash memory has a characteristic that, as the amount of electric charge injected to the cells increases, the degree of wear of the cells becomes higher, and the durability thereof is degraded. Thus, in the case of the SLC mode, the durability of a cell is degraded more in the case of a logical value "0" (after injection of electric charge) than in the case of a logical value "1" (erased state). In the case of the MLC mode, the distribution C having a maximum threshold voltage has a highest degree of wear of the cell. Thus, a technique has been proposed in which write data for a flash memory is compressed, and empty bits generated due to the compression are padded with a logical value "1" having a small amount of electric charge. However, in this technique, after the upper page and the lower page are compressed together, the padding data is inserted. For this reason, a read operation and a write operation cannot be independently performed in the upper page and the lower page.

Thus, in this embodiment, page data to be written is compressed in units of pages. For example, in the case of the MLC mode, the lower page data is compressed and has padding data added thereto, and then, is written into a lower page, and the upper page data is compressed and has padding data added thereto, and then, is written into an upper page. The data length after the padding processing is the same as the data length before the compression processing. The padding data is determined such that a distribution having a high threshold voltage does not appear. In other words, the padding data is determined such that at least a distribution having a maximum threshold voltage does not appear.

In this embodiment, the compression data and the padding data are arranged on the upper page and the lower page such that the number of cells in which compression data is written in both the upper page and the lower page is minimized. Accordingly, the appearance frequency of the distribution C is minimized. In other words, while a cell having the padding data written into at least one of the upper page and the lower page has a threshold voltage distribution other than the distribution C, there is a possibility that a cell having the compression data written into both the upper page and the lower page has a threshold voltage distribution of the distribution C.

In the first embodiment, in the upper page, first recording data is written. The first recording data is generated such that compressed upper page data is written into a plurality of first cells among a plurality of cells included in a physical sector, and first padding data is written into second cells excluding the first cells among the plurality of cells. The first cells include a plurality of cells arrayed to be wrappable around in a first direction from a certain third cell (first cell position). In the lower page, second recording data is written. The second recording data is generated such that compressed lower page data is written into a plurality of fourth cells among the plurality of cells included in the physical sector, and second padding data is written into fifth cells excluding the fourth cells among the plurality of cells. The fourth cells include a plurality of cells arrayed to be wrappable around in a second direction from a certain sixth cell (second cell position).

The elements of the data processing unit 30 illustrated in FIG. 1 will be described. The physical address determining unit 38 translates the write address WrAddr into the physical address Addr by using the logical/physical translation table and outputs the physical address Addr to the page determining unit 33, the metadata managing unit 39, and the output unit 35. In addition, the physical address determining unit 38 translates the read address RdAddr into the physical address Addr by using the logical/physical translation table and outputs the physical address Addr to the page determining unit 33, the metadata managing unit 39, and the input unit 41. The function performed by the physical address determining unit 38 may be performed by the control unit 20.

The page determining unit 33 determines a page, which is a write target page, among N pages included in one physical sector MS described above. In the case of the MLC mode in which one physical sector MS is associated with two pages, the page determining unit 33 determines whether the write target page is an upper page or a lower page. The page determining unit 33 notifies a result of the determination to the padding unit 32. Similarly, the page determining unit 33 determines whether a read target page is an upper page or a lower page and notifies a result of the determination to the decompression unit 44.

The compression unit 31 performs lossless compression of write data WrData input from the control unit 20 and decreases the number of bits of the write data WrData. A technique used for the compression is arbitrary, and a technique capable of lossless compression is used. When the compression corresponding to one page of the write data WrData is completed, the compression unit 31 calculates a compression rate CR and outputs compression data CpData and the compression rate CR to the padding unit 32. The compression rate CR, for example, is represented as a percentage of a data length after the compression to a data length of the write data WrData corresponding to one page. In addition, the compression unit 31, when data of one page is compressed, outputs a compression flag Cpflag representing whether or not the compression rate CR is less than 100% to the selector 34 and the metadata managing unit 39. For example, when the compression flag Cpflag=1, it represents that the compression is performed with the compression rate CR being less than 100%. On the other hand, when the compression flag Cpflag=0, it represents that the compression rate CR is equal to or more than 100%, and the compression cannot be performed.

The metadata managing unit 39 stores and manages the management information (metadata) of each page. FIG. 4 illustrates an example of a metadata table managed by the metadata managing unit 39. In this metadata table, a number of times of writing (write count) and the compression flag Cpflag are managed for each page address of the NAND 10. The write count is an accumulated count value and is incremented at timing when writing data into both the upper page and the lower page of a same physical sector is completed. Accordingly, the write counts of the upper page and the lower page included in a same physical sector are the same. At the time of writing data, the metadata managing unit 39 outputs a write count corresponding to a physical address Addr input from the physical address determining unit 38 to the padding unit 32. At the time of reading data, the metadata managing unit 39 outputs a write count corresponding to the physical address Addr and the compression flag Cpflag to the decompression unit 44. In place of the write count, an erase count for each page may be managed. Based on the compression flag Cpflag, it is determined whether or not data to be written into each page of the NAND 10 is compressed. The function performed by the metadata managing unit 39 may be performed by the control unit 20.

Based on the result of the page determination and the compression data CpData, the compression rates CR, and the write counts of the lower page and the upper page, the padding unit 32 performs a padding processing for the compression data CpData of the lower page and the upper page.

Figure 5A:
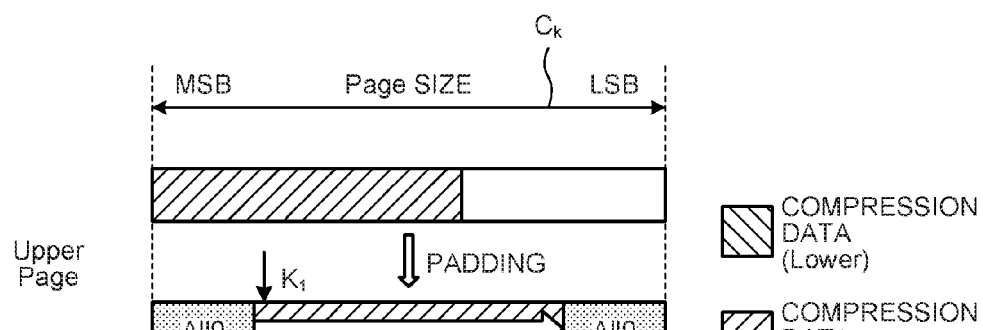
FIG. 5A is a diagram that illustrates upper page data after compression and the upper page data after padding.
Figure 5B:
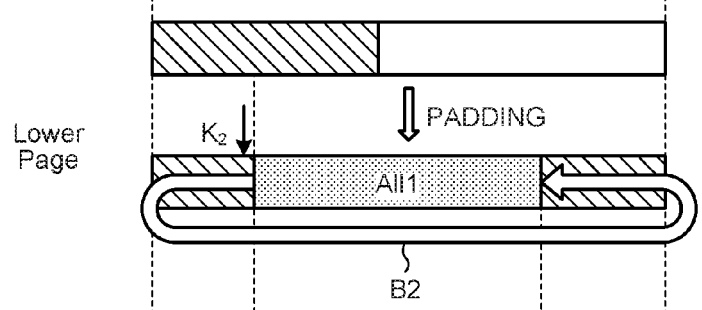
FIG. 5B is a diagram that illustrates lower page data after compression and the lower page data after padding.
Figure 5C:
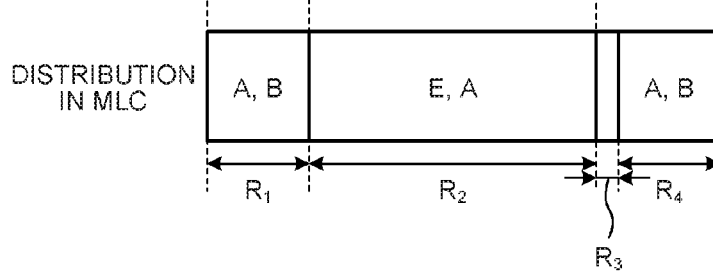
FIG. 5C is a diagram that illustrates threshold voltage distributions appearing after padding.

The padding processing will be described with reference to FIGS. 5A to 5C. In FIGS. 5A to 5C, a range represented by an arrow Ck corresponds to the size of one page. Here, the size of one page is assumed to be M bits. In FIGS. 5A to 5C, each frame of rectangle of a length corresponding to the arrow Ck corresponds to one physical sector MS (see FIG. 2) including a plurality of cells. A right end of each rectangle represents a cell corresponding to the LSB of an address designated by a plurality of bit lines BL0 to BLm (see FIG. 2), and a left end of each rectangle represents a cell corresponding to the MSB.

An upper diagram in FIG. 5A illustrates an example of the compression data CpData of an upper page, and a lower diagram in FIG. 5A illustrates an example of the data of the upper page after a padding processing. In FIG. 5A, an area to which left-downward hatching is applied corresponds to the compression data CpData of the upper page, and a blank portion corresponds to an area in which data does not exist according to the compression. Accordingly, padding data having data length corresponding to the blank portion is added. In an area to which dots are added, the padding data is added. An arrow K1 represents the position of the start bit of the compression data of the upper page. As illustrated in FIG. 5A, into a plurality of cells arrayed from the start position (cell position) represented by the arrow K1 toward the LSB side, the compression data of the upper page is written to have a bit arrangement represented by an arrow B1. Accordingly, the compression data of the upper page is arranged from the MSB side to the LSB side. When the compression data reaches the LSB, the data is wrapped around from the MSB. In an area in which the compression data of the upper page is not written, padding data of "0" is written.

An upper diagram in FIG. 5B illustrates an example of the compression data CpData of a lower page, and a lower diagram in FIG. 5B illustrates an example of the data of the lower page after a padding processing. In FIG. 5B, an area to which right-downward hatching is applied corresponds to the compression data CpData of the lower page, and a blank portion corresponds to an area in which data does not exist according to the compression. An arrow K2 represents the position of the start of the compression data of the lower page. The bit position represented by the arrow K2 is adjacent to the bit position represented by the arrow K1 toward the MSB. In other words, when an offset of the start position of the upper page from the MSB is K bits, K1=K, and K2=K−1. As illustrated in FIG. 5B, in a plurality of cells arrayed from the start position (cell position) represented by the arrow K2 toward the MSB side, the compression data of the lower page is written to have a bit arrangement represented by an arrow B2. Accordingly, the compression data of the lower page is arranged from the LSB side to the MSB side. In this case, since the compression data reaches the MSB, the data is wrapped around from the LSB. In an area in which the compression data of the lower page is not written, padding data of "1" is written.

FIG. 5C illustrates a threshold voltage distribution of MLCs appearing in each area. In a cell included in an area R1 or an area R4, since the upper page data is the padding data of "0", the distribution A or the distribution B appears. In a cell included in an area R2, since the lower page data is the padding data of "1", the distribution E or the distribution A appears. In a cell included in the area R3, since both the upper page data and the lower page data are compression data, there is a possibility that all the distributions E, A, B, and C appear. Accordingly, in the example illustrated in FIGS. 5A to 5C, the distribution C appears only in the area R3.

The padding unit 32 performs predetermined calculation based on the write count and calculates a value K used for defining the start positions K1 and K2. For example, the padding unit 32 divides the write count by M bits representing the page size and sets a remainder thereof as the value K. Through such calculation, the value K becomes different in accordance with the write count. By performing such control, the positions of cells each having a possibility that the distribution C having a maximum threshold voltage appears can be changed. Accordingly, a cell having a large damage of a tunnel oxide film due to a large amount of injected electric charge is circulated, whereby the damages of cells can be leveled. The padding unit 32 performs the padding processing as illustrated in FIG. 5A for the compression data of the upper page and outputs a result of the padding processing to the selector 34 as a padding processing output PdData. In addition, the padding unit 32 performs the padding processing as illustrated in FIG. 5B for the compression data of the lower page and outputs a result of the padding processing to the selector 34 as a padding processing output PdData.

Figure 6:
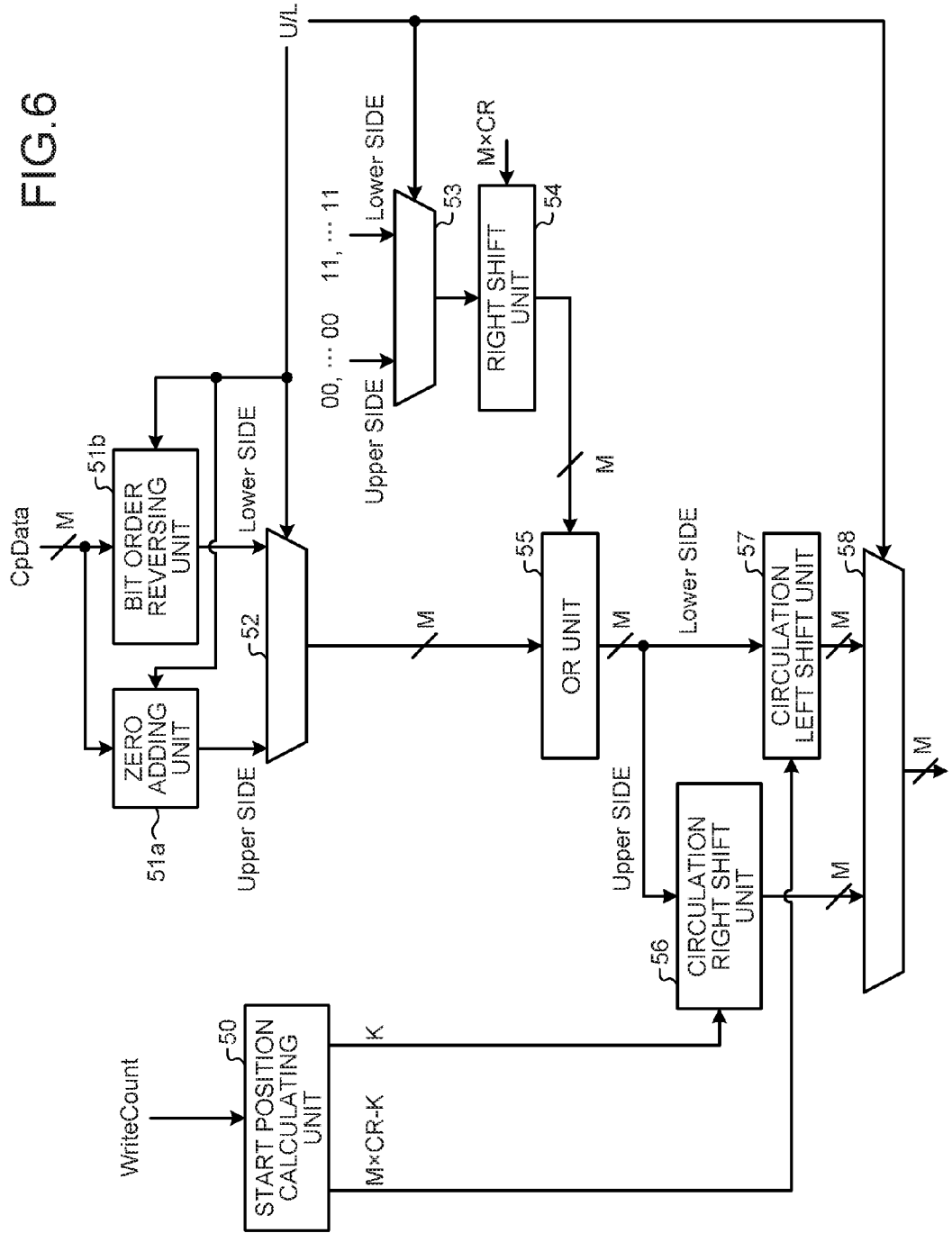
FIG. 6 is a diagram that illustrates an example of the circuit configuration of a padding unit.

FIG. 6 is a diagram that illustrates an example of the hardware circuit configuration used for realizing the function of the padding unit 32. This hardware circuit includes: a start position calculating unit 50; a zero adding unit 51a; a bit order reversing unit 51b; a selector 52; a selector 53; a right shift unit 54; an OR unit 55; a circulation right shift unit 56; a circulation left shift unit 57; and a selector 58. Here, the page size is assumed to be M bits.

The start position calculating unit 50 calculates a start position K1 (=K) of the upper page data based on the write count and outputs the start position K1 (=K) to the circulation right shift unit 56. In addition, the start position calculating unit 50 calculates a start position K2 (=M×CR−K) of the lower page data based on the write count, the number M of bits of one page, and the compression rate CR of the lower page and outputs the start position K2 to the circulation left shift unit 57. In this case, M×CR represents the number of bits of the compression data of the lower page.

The zero adding unit 51a outputs M-bit data acquired by adding "0" of one or a plurality of bits to the compression data CpData of the upper page. The zero adding unit 51a outputs data so as to fill "0" toward the MSB side. In this embodiment, the MSB filling data is described like d0, d1, d2, . . . , dm, 0, 0, 0, such that a data section d0, d1, d3, . . . , dm is arranged first, and "0" is continued thereafter.

The bit order reversing unit 51b outputs M-bit data of the lower page acquired by adding "0" of one or a plurality of bits to the compression data CpData of the lower page of which the bit order is reversed. The bit order reversing unit 51b outputs data so as to fill toward the MSB side.

The selector 52 selects an input from the zero adding unit 51a at the time of an upper page and selects an input from the bit order reversing unit 51b at the time of a lower page. The selector 52 outputs the selected input to the OR unit 55.

The selector 53 selects the padding data "0" of M bits at the time of an upper page and selects the padding data "1" of M bits at the time of a lower page. The right shift unit 54 shifts the input from the selector 53 to the right side by (M×CR) bits and inserts "0" into bit positions that become blank according to the shift. In this case, M×CR represents the number of bits of the compression data CpData of the lower page. Here, the right shift represents that data is shifted to the LSB side.

The OR unit 55 performs OR operation between the M-bit data input from the selector 52 and the M-bit padding data input from the right shift unit 54 and outputs a result thereof. The circulation right shift unit 56 performs a circulated right shift of the upper page data input from the OR unit 55 by the K1 bits and outputs a shift result to the selector 58. The circulation left shift unit 57 performs a circulated left shift of the lower page data input from the OR unit 55 by the K2 bits and outputs a shift result to the selector 58. Here, the left shift represents that data is shifted to the MSB side. The selector 58 selects and outputs upper page data input from the circulation right shift unit 56 at the time of an upper page and selects and outputs the lower page data input from the circulation left shift unit 57 at the time of a lower page.

A specific example will be described. It is assumed that M=10. It is assumed that K=3. In addition, it is assumed that the compression rate CR of the upper page is 60%, and u0, u1, u2, u3, u4, and u5 of six bits are input as the compression data of the upper page. It is assumed that the compression rate CR of the lower page is 70%, and 10, 11, 12, 13, 14, 15, and 16 of seven bits are input as the compression data of the lower page.

First, the case of an upper page will be described. As the compression data CpData, u0, u1, u2, u3, u4, and u5 are input. The zero adding unit 51a outputs an MSB-filled data string "u0, u1, u2, u3, u4, u5, 0, 0, 0, 0". The selector 52 outputs "u0, u1, u2, u3, u4, u5, 0, 0, 0, 0". The right shift unit 54 outputs a padding data string "0, 0, 0, 0, 0, 0, 0, 0, 0, 0". The OR unit 55 outputs "u0, u1, u2, u3, u4, u5, 0, 0, 0, 0". The circulation right shift unit 56 performs circulated right shift of three bits and outputs "0, 0, 0, u0, u1, u2, u3, u4, u5, 0".

The case of a lower page will be described. As the compression data CpData, 10, 11, 12, 13, 14, 15, and 16 are input. The bit order reversing unit reverses the bit order and adds "0"s and outputs an MSB-filled data string "16, 15, 14, 13, 12, 11, 10, 0, 0, 0". The selector 52 outputs "16, 15, 14, 13, 12, 11, 10, 0, 0, 0". The right shift unit 54 outputs a padding data string "0, 0, 0, 0, 0, 0, 0, 1, 1, 1". The OR unit 55 outputs "16, 15, 14, 13, 12, 11, 10, 1, 1, 1". The circulation left shift unit 57 performs a circulated left shift of four (=7−3) bits and outputs "12, 11, 10, 1, 1, 1, 16, 15, 14, 13".

Referring back to FIG. 1, the selector 34 selects one of the write data WrData before the compression and the padding processing output PdData input from the padding unit 32 based on the compression flag Cpflag and outputs the selected data to the output unit 35 as output data OpData. The selector 34 selects the write data WrData when Cpflag=0 and selects the padding processing output PdData when Cpflag=1.

The output unit 35 includes: an ECC coding unit 36; and a write buffer 37. The ECC coding unit 36 performs an error-correction coding processing for the output data OpData and generates a parity. The ECC coding unit 36 stores a code word including data and the parity in the write buffer 37. The output unit 35 outputs the code word stored in the write buffer 37 to the NAND 10 together with the physical address Addr.

The input unit 41 includes: an ECC decoding unit 42; and a read buffer 43. The input unit 41 reads a code word from a page of the NAND 10 that corresponds to the physical address Addr. The input unit 41 stores the read code word in the read buffer 43. The input unit 41 inputs the code word stored in the read buffer 43 to the ECC decoding unit 42. The ECC decoding unit 42 performs an error correction decoding processing by using the input code words and inputs decoded data (read data) to the decompression unit 44.

When the read data is input, the decompression unit 44 acquires a compression flag Cpflag and a write count corresponding to the physical address Addr of the read data from the metadata managing unit 39. The decompression unit 44 determines whether or not the read data is compressed based on the compression flag Cpflag. In a case where the read data is not compressed, the decompression unit 44 outputs the input read data as it is to the control unit 20 as read data RdData.

On the other hand, in a case where the read data is compressed, the decompression unit 44 determines whether a read target page is an upper page or a lower page based on a result of the determination made by the page determining unit 33. In addition, the decompression unit 44 performs the predetermined calculation based on the write count and calculates a value K defining the start positions K1 and K2. In a case where the read target page is an upper page, the decompression unit 44 calculates the start position K1 based on the calculated value K, performs a decompression processing for the read data from the start position K1 toward the LSB side, and restores the compression data (read data) to the original write data WrData. The decompression processing is a translation processing in a direction opposite to that of the compression processing performed by the compression unit 31. Until the data length becomes the length of the write data corresponding to the original one page, the decompression unit 44 performs the decompression processing of the input read data from the start position K1 and completes the decompression processing when the data length becomes a length corresponding to the original one page. Through such a decompression processing, the padding data added by the padding unit 32 is eliminated. In a case where the read target page is a lower page, the decompression unit 44 calculates the start position K2 based on the calculated value K, performs a decompression processing for the data from the start position K2 toward the MSB side, and restores the compression data (read data) to the original write data WrData. The restored write data WrData is output to the control unit 20 as read data RdData.

Figure 7:
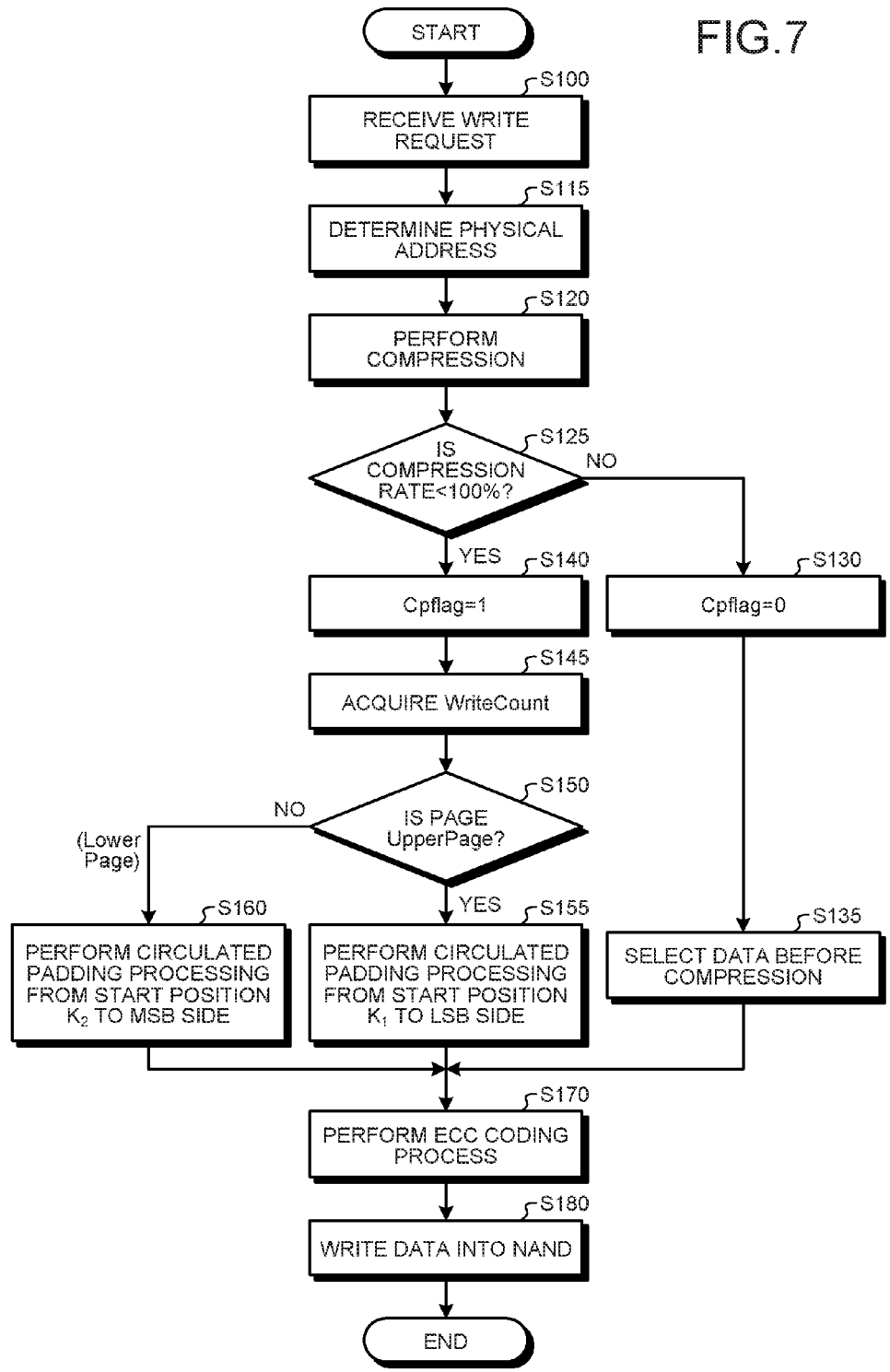
FIG. 7 is a flowchart that illustrates an example of an operation sequence at the time of writing data in the memory system according to the first embodiment.

Next, the operation sequence of the memory system 100 performed when a write request is received from the host 1 will be described with reference to a flowchart illustrated in FIG. 7. When a write request is received from the host 1 (S100), the control unit 20 temporarily stores write data in the buffer memory 25. The control unit 20 outputs the write data WrData stored in the buffer memory 25 to the data processing unit 30. In addition, the control unit 20 outputs a write address WrAddr designated by the write request to the data processing unit 30. The physical address determining unit 38 outputs a physical address Addr translated from the input write address WrAddr to the page determining unit 33 and the metadata managing unit 39 (S115).

The page determining unit 33 determines a page, which is a write target page, among N pages included in one physical sector MS described above. In the case of the MLC mode, the page determining unit 33 determines whether the write target page is an upper page or a lower page. The page determining unit 33 notifies a result of the determination to the padding unit 32.

The compression unit 31 compresses the write data WrData of one page size input from the control unit 20 (S120). When the compression of the write data WrData of one page size is completed, the compression unit 31 calculates a compression rate CR. The compression unit 31 determines whether or not the calculated compression rate CR is less than 100% (S125). When the compression rate CR is less than 100%, the compression unit 31 sets the compression flag Cpflag to "1" (S140). On the other hand, when the compression rate CR is equal to or more than 100%, the compression unit 31 sets the compression flag Cpflag to "0" (S130). The compression unit 31 outputs the compression flag Cpflag to the selector 34 and the metadata managing unit 39. The compression unit 31 outputs the compression data CpData and the compression rate CR to the padding unit 32.

When the compression flag Cpflag is "0", the selector 34 selects the write data WrData (S135) and outputs the selected write data WrData to the output unit 35 as output data OpData. The ECC coding unit 36 performs an error correction coding processing for the output data OpData (S170) and writes a code word including the data and the parity into the NAND 10 through the write buffer 37 (S180).

The metadata managing unit 39 outputs a write count corresponding to the physical address Addr to the padding unit 32. The padding unit 32 performs the predetermined calculation based on the write count and calculates a value K defining the start positions K1 and K2 (S145). The padding unit 32 performs a padding processing based on the result of the page determination notified from the page determining unit 33 and the start positions K1 and K2 defined by the value K. In the case of an upper page (S150: Yes), as illustrated in FIG. 5A, the padding unit 32 performs the padding processing such that the compression data CpData and the padding data string "0" are written from the start position K1 to the LSB side. In a case where the compression data or the padding data "0" reaches the LSB, the data is wrapped around from the MSB (S155). On the other hand, in the case of a lower page (S150: No), as illustrated in FIG. 5B, the padding unit 32 performs the padding processing such that the compression data CpData and the padding data string "1" are written from the start position K2 to the MSB side. In a case where the compression data or the padding data "1" reaches the MSB, the data is wrapped around from the LSB (S160).

When the compression flag Cpflag is "1", the selector 34 selects the padding processing output PdData and outputs the selected padding processing output PdData to the output unit 35 as output data OpData. The ECC coding unit 36 performs an error correction coding processing for the output data OpData (S170) and writes a code word including the data and the parity into the NAND 10 through the write buffer 37 (S180).

Figure 8:
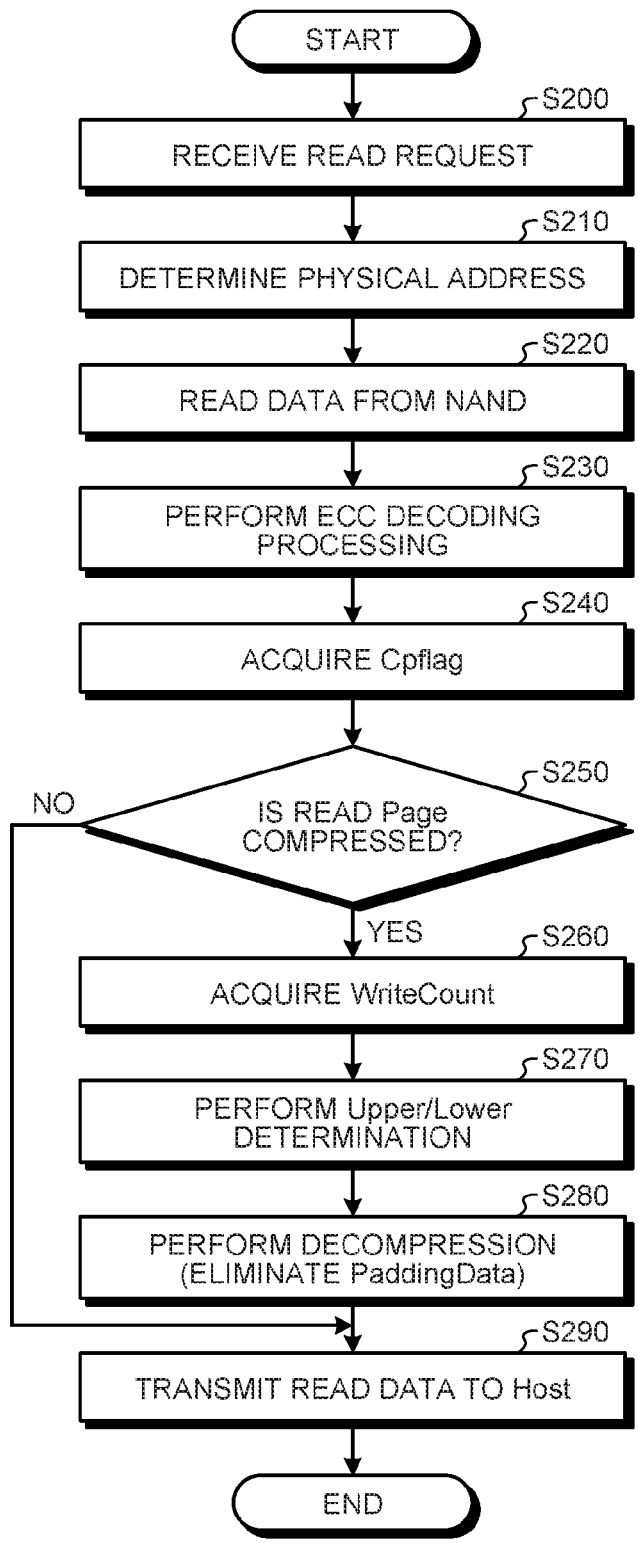
FIG. 8 is a flowchart that illustrates an example of an operation sequence at the time of reading data in the memory system according to the first embodiment.

Next, the operation sequence of the memory system 100 performed when a read request is received from the host 1 will be described with reference to a flowchart illustrated in FIG. 8. When a read request is received from the host 1 (S200), the control unit 20 outputs a read address RdAddr designated by the read request to the data processing unit 30. The physical address determining unit 38 outputs a physical address Addr translated from the read address RdAddr to the decompression unit 44 and the input unit 41 (S210).

The input unit 41 reads a code word from the page of the NAND 10 based on the physical address Addr (S220). The input unit 41 inputs the read code word to the ECC decoding unit 42 through the read buffer 43. The ECC decoding unit 42 performs an error correction decoding processing by using the code words and inputs decoded data to the decompression unit 44 (S230).

The decompression unit 44 acquires a compression flag Cpflag corresponding to the physical address Addr of the read data from the metadata managing unit 39 (S240). The decompression unit 44 determines whether or not the read data is compressed based on the compression flag Cpflag (S250). When the compression flag Cpflag=0, and the read data is not compressed (S250: No), the decompression unit 44 outputs the input read data to the control unit 20 as it is. The control unit 20 transmits the read data RdData input from the data processing unit 30 to the host 1 through the host I/F 4 (S290).

When the compression flag Cpflag=1, and the read data is compressed (S250: Yes), the decompression unit 44 acquires a write count corresponding to the physical address Addr of the read data from the metadata managing unit 39 (S260). The decompression unit 44 calculates the start positions K1 and K2 of the data string based on the write count. The decompression unit 44 determines whether the read target page is an upper page or a lower page based on the result of the determination made by the page determining unit 33 (S270). In a case where the read target page is an upper page, the decompression unit 44 performs a decompression processing for the read data from the start position K1 to the LSB side and restores the compression data to the original write data WrData. On the other hand, in a case where the read target page is a lower page, the decompression unit 44 performs a decompression processing for the read data from the start position K2 to the MSB side and restores the compression data to the original write data WrData (S280). The decompression unit 44 outputs decompressed data to the control unit 20 as read data RdData. The control unit 20 transmits the read data RdData input from the data processing unit 30 to the host 1 through the host I/F 4 (S290).

In this way, according to the first embodiment, the upper page data and the padding data are arranged from a first cell toward one of the LSB side and the MSB side, and the lower page data and the padding data are arranged from a second cell adjacent to the first cell toward the other side. Accordingly, the compression data of each page is arranged in a distributed manner, the number of cells in which the compression data is written into both the upper page and the lower page is minimized, and the frequency of the appearance of the distribution C having a maximum threshold voltage is minimized. In addition, since the storage positions of the compression data and the padding data are controlled so as to be shifted in accordance with the write count, the position of a cell in which there is a possibility that the distribution C having a high threshold voltage appears can be changed, and accordingly, the damages of cells can be leveled. In addition, the compression and the padding processing are performed in units of pages at the time of writing data, and, the decompression processing can be performed in units of pages at the time of reading data, whereby a low latency and a high throughput at the time of reading data or writing data can be realized.

In addition, in a case where a redundant area can be secured in the page data, the compression flag Cpflag may be added to the page data so as to be written into the NAND 10. Furthermore, it may be configured such that the upper page data is arranged toward the MSB side, and the lower page data is arranged toward the LSB side.

Second Embodiment

Figure 9:
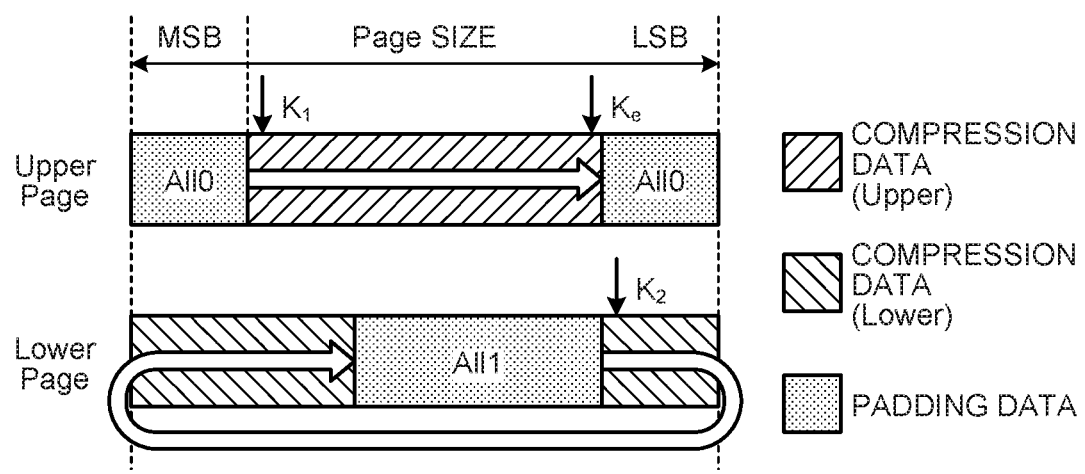
FIG. 9 is a diagram that illustrates a padding processing performed by a memory system according to a second embodiment.

In a second embodiment, the start position K2 of the compression data CpData of the lower page is changed to the side of the last bit position of the compression data CpData of the upper page. FIG. 9 is a diagram that illustrates a padding processing according to the second embodiment. An upper diagram in FIG. 9 illustrates an example of the padding processing of an upper page, and a lower diagram in FIG. 9 illustrates an example of the padding processing of a lower page. The compression data CpData of the upper page, similarly to the first embodiment, is arranged from a start position K1 to the LSB side. The start position K2 used for writing the compression data of the lower page is set as a bit position adjacent to a last bit Ke of the compression data CpData of the upper page toward the LSB. In the second embodiment, the compression data CpData of the lower page is arranged from the start position K2 to the LSB side. In other words, the arrangement directions of the compression data of the upper page and the compression data of the lower page are the same. In the case of the lower diagram in FIG. 9, since the compression data of the lower page reaches the LSB, and the data is wrapped around from the MSB.

Figure 10:
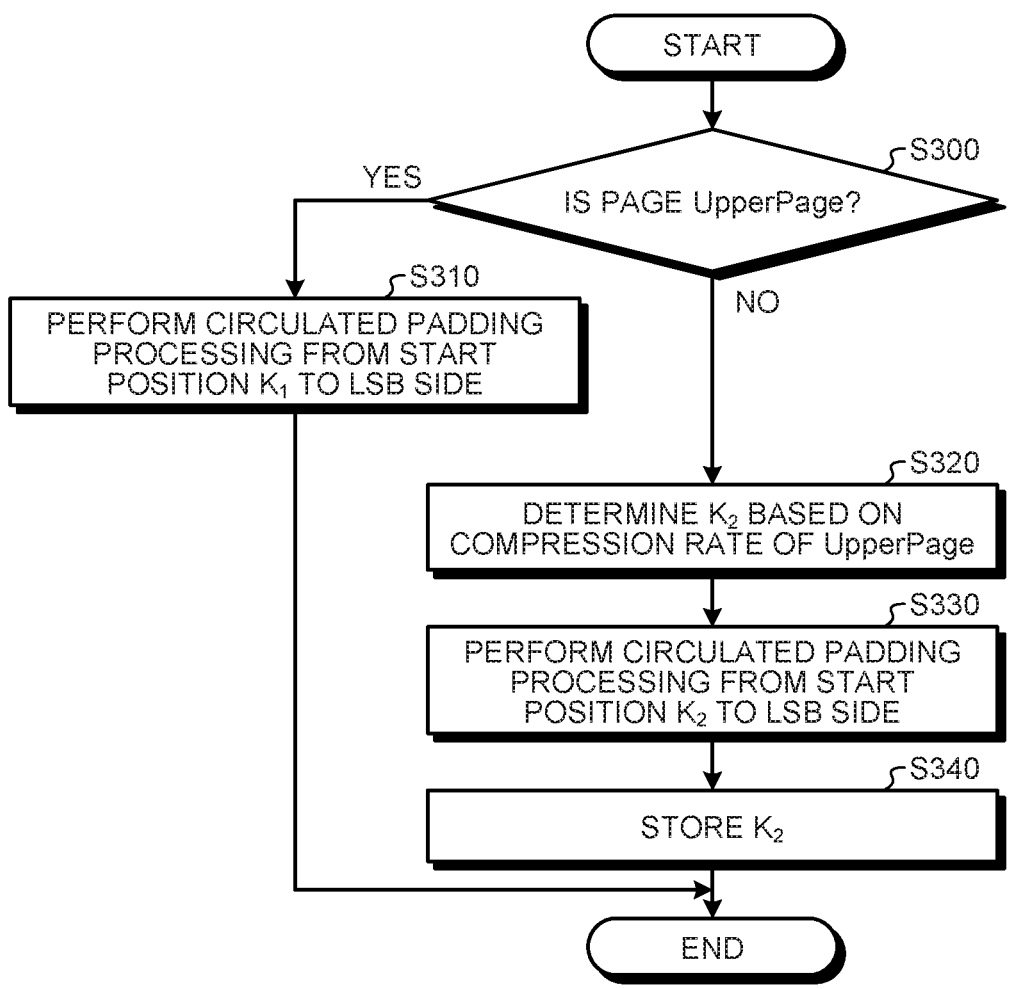
FIG. 10 is a flowchart that illustrates an example of an operation sequence at the time of wiring data in the memory system according to the second embodiment.

The operation sequence of a memory system 100 according to the second embodiment that is performed when a write request is received from the host 1 will be described with reference to a flowchart illustrated in FIG. 10. The sequence of S300 to S340 illustrated in FIG. 10 corresponds to the sequence of S150 to S160 illustrated in FIG. 7, and a duplicate sequence will not be described. A padding unit 32 determines whether a write target page is an upper page or a lower page (S300). In a case where the write target page is an upper page (S300: Yes), the padding unit 32, as illustrated in the upper diagram in FIG. 9, performs a padding processing such that the compression data CpData and a padding data string "0" are written from the start position K1 to the LSB side. In a case where the compression data or the padding data "0" reaches the LSB, the data is wrapped around from the MSB (S310).

In a case where the write target page is a lower page (S300: No), the padding unit 32 calculates a length of the compression data of the upper page based on the compression rate CR of the upper page. The padding unit 32 calculates a last bit position of the compression data CpData based on the start position K1 and the length of the compression data of the upper page. The padding unit 32 sets a bit position, as a start position K2 of the lower page, adjacent to the calculated last bit position toward the LSB side (S320). The padding unit 32, as illustrated in the lower diagram in FIG. 9, performs a padding processing such that the compression data CpData and a padding data string "1" are written from the start position K2 to the LSB side. In a case where the compression data or the padding data "1" reaches the LSB, the data is wrapped around from the MSB (S330). The padding unit 32 outputs the calculated start position K2 to the metadata managing unit 39. The metadata managing unit 39 stores the start position K2 in association with a page address of the write target (S340).

In this case, while the upper page is written first in the NAND 10, in a case where the lower page is written first in the NAND 10, the start position of the upper page may be determined based on the bit position and the length of the compression data of the lower page.

Figure 11:
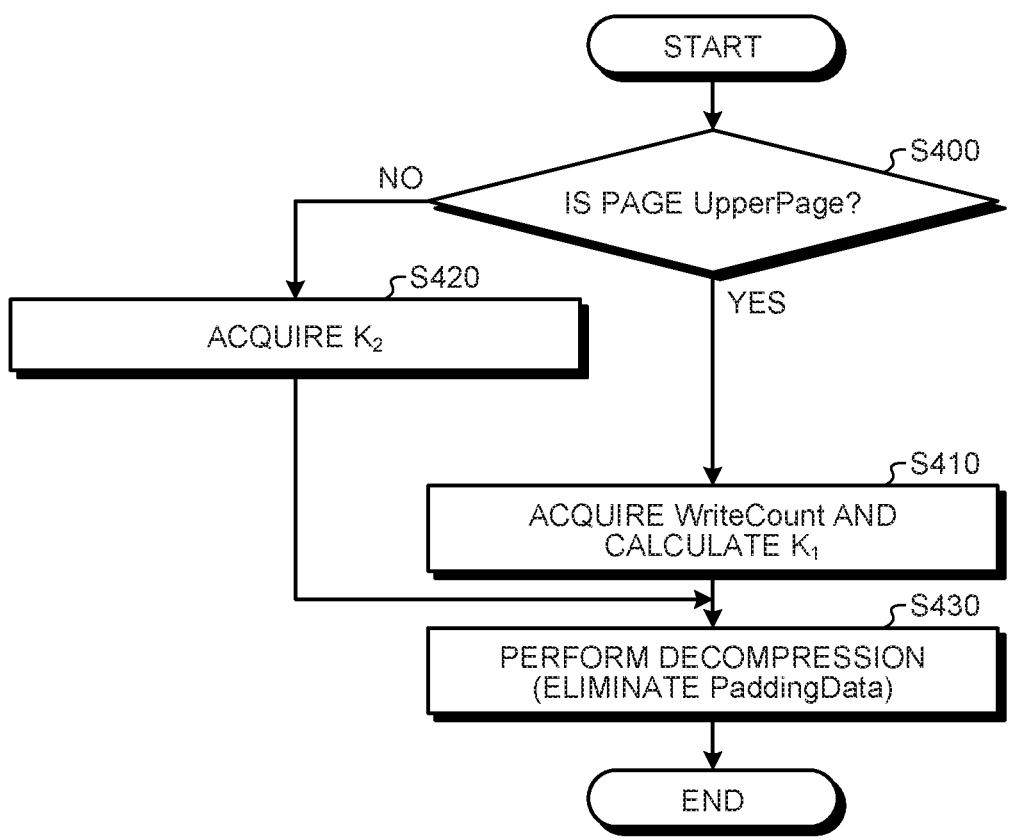
FIG. 11 is a flowchart that illustrates an example of an operation sequence at the time of reading data in the memory system according to the second embodiment.

Next, the operation sequence of the memory system 100 according to the second embodiment performed when a read request is received from the host 1 will be described with reference to a flowchart illustrated in FIG. 11. The sequence of S400 to S430 illustrated in FIG. 11 corresponds to the sequence of S260 to S280 illustrated in FIG. 8, and a duplicate sequence will not be described. When the compression flag Cpflag=1, and the read data is compressed, the decompression unit 44 determines whether a read target page is an upper page or a lower page based on a result of the determination made by the page determining unit 33 (S400). In a case where the read target page is an upper page, the decompression unit 44 acquires a write count corresponding to the physical address Addr of the read data and calculates a start position K1 based on the write count (S410). The decompression unit 44 performs a decompression processing for the read data from the start position K1 to the LSB side and restores the compression data of the upper page to the original write data WrData (S430). In a case where the read target page is a lower page, the decompression unit 44 acquires a start position K2 corresponding to the physical address Addr of the read data from the metadata managing unit 39 (S420). The decompression unit 44 performs a decompression processing for the read data from the start position K2 to the LSB side and restores the compression data of the lower page to the original write data WrData (S430). In the case of this second embodiment, the decompression unit 44 decompresses input data from the start position K1 or K2 to the LSB side regardless of whether the read target page is an upper page or a lower page.

In addition, in the description presented above, while the start position K2 of the lower page is stored and managed as metadata, another technique as below may be used. According to another technique, before the data of the lower page is decompressed, by decompressing the compression data of the upper page until it becomes the length of the one-page data and determining a bit position at which the completion of the decompression is detected, a last bit position of the compression data of the upper page is determined. Then, a bit position adjacent to this last bit position on the LSB side is set as the start position K2.

In this way, according to the second embodiment, the upper page data and the padding data are arranged from a first cell to one of the LSB side and the MSB side, and the lower page data and the padding data are arranged, to the one side direction, from a second cell adjacent to the last bit position of the upper page data toward the one side. Accordingly, the compression data of each page is arranged in a distributed manner, the number of cells in which the compression data is written into both the upper page and the lower page is minimized, and the appearance frequency of the distribution C having a maximum threshold voltage is minimized.

Third Embodiment

Figure 12:
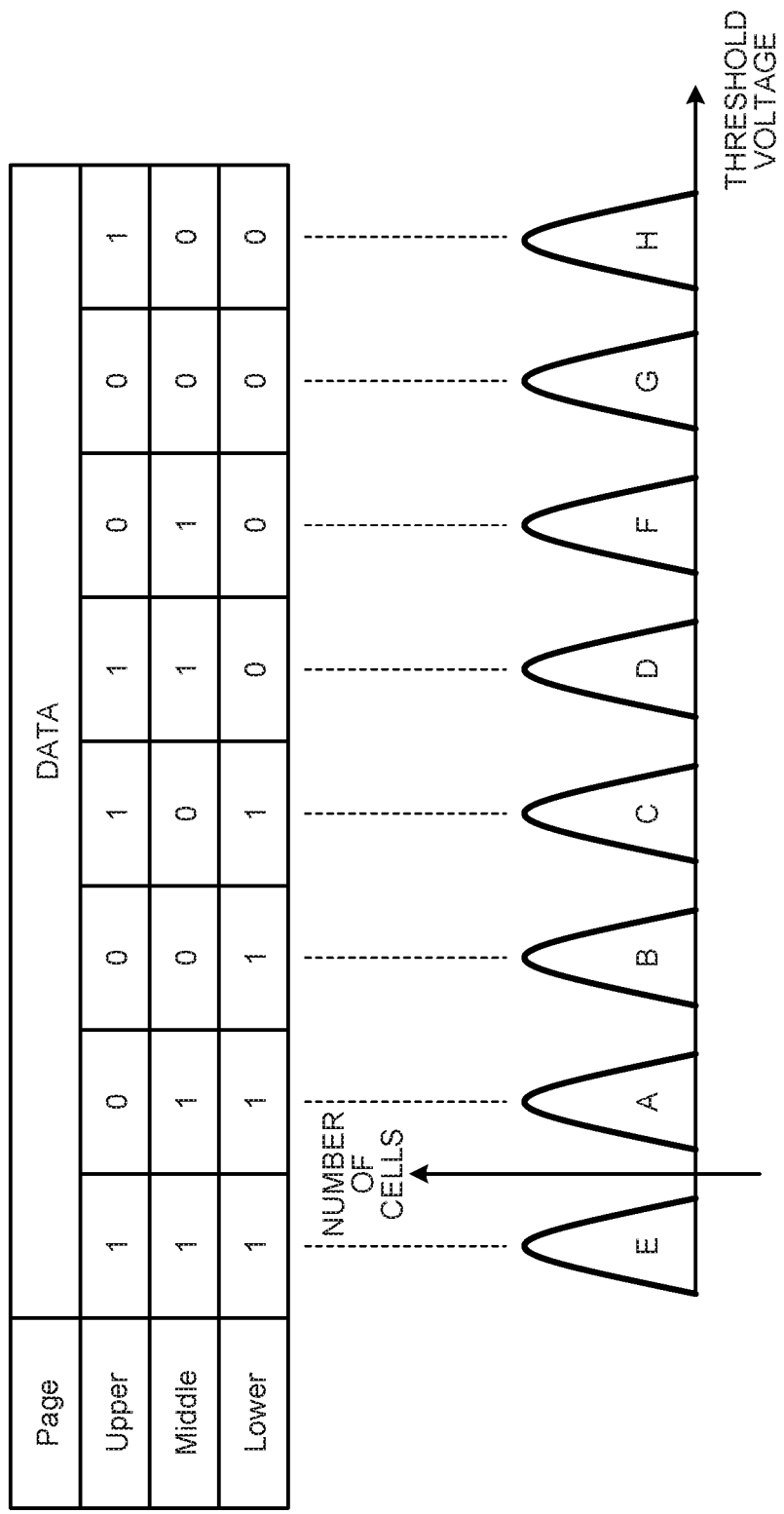
FIG. 12 is a diagram that illustrates an example of threshold voltage distributions and data coding of memory cells of three bits/cell.

In a third embodiment, a padding processing of TLC mode cells (three bits/cell) will be described. FIG. 12 is a diagram that illustrates an example of threshold voltage distributions and data coding of cells of the TLC mode. As illustrated in a lower diagram in FIG. 12, in the case of cells of the three bits/cell, eight distributions formed by a distribution E, a distribution A, a distribution B, a distribution C, a distribution D, a distribution F, a distribution G, and a distribution H are included. The distribution E has a lowest threshold voltage and corresponds to a threshold voltage distribution of an erased state. The threshold voltage is higher in order of the distributions A, B, C, D, F, G, and H. Thus, the distribution H has a maximum threshold voltage. In a case where cells of three bits/cell are used, data values of three bits are associated with the eight threshold distributions E, A, B, C, D, F, G, and H. In a case where the three bits/cell is used, one physical sector corresponds to these three pages. Three bits that can be stored by each cell correspond to these three pages. In this embodiment, these three pages will be referred to as a lower page, a middle page, and an upper page.

In FIG. 12, an upper diagram is a diagram that illustrates an example of data coding. The distribution E corresponds to a data value of "111", the distribution A corresponds to a data value of "011", the distribution B corresponds to a data value of "001", the distribution C corresponds to a data value of "101", the distribution D corresponds to a data value of "110", the distribution F corresponds to a data value of "010", the distribution G corresponds to a data value of "000", and the distribution H corresponds to a data value of "100". In this embodiment, when data of the upper page is denoted by Du, data of the middle page is denoted by Dm, and data of the lower page is denoted by Dl, the data value of three bits will be denoted as "DuDmDl". The data coding illustrated in FIG. 12 is an example, and the data coding is not limited to the example illustrated in FIG. 12.

Figure 13:
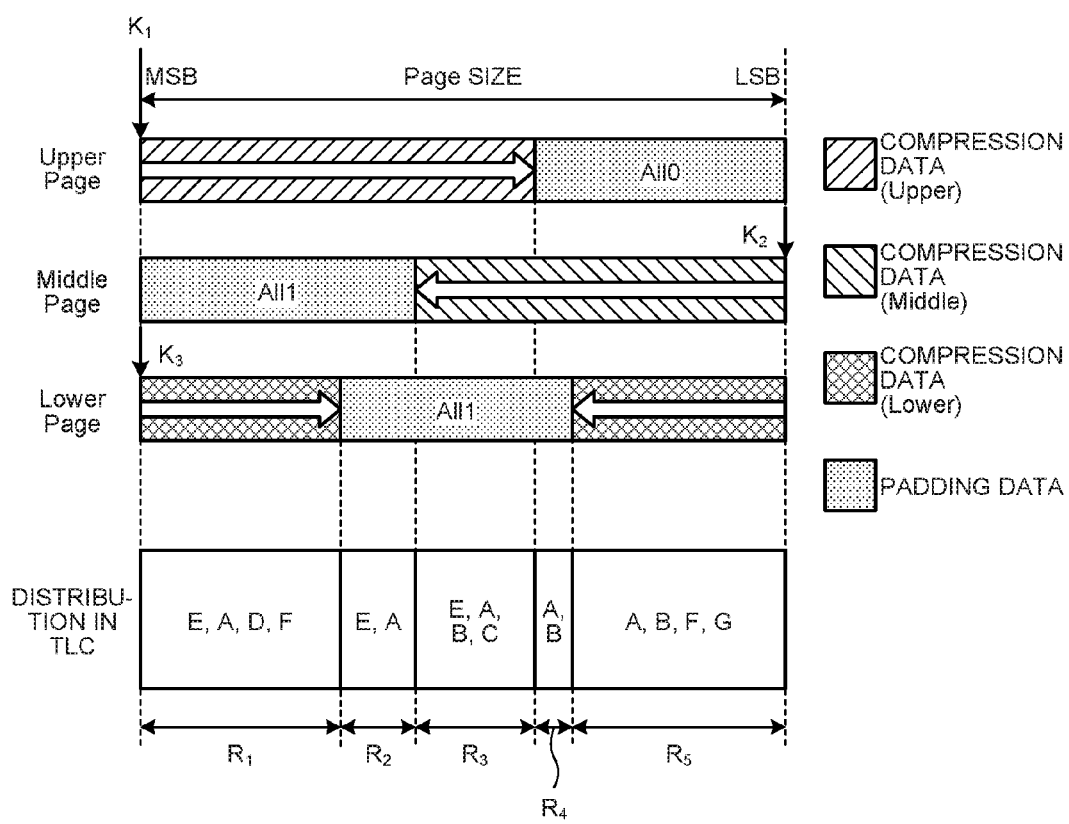
FIG. 13 is a diagram that illustrates a padding processing performed by a memory system according to a third embodiment.

FIG. 13 is a diagram that illustrates a padding processing according to the third embodiment. In the order from the upper side in FIG. 13, examples of the padding processing of an upper page, a middle page, and a lower page are illustrated. A lower diagram illustrated in FIG. 13 illustrates a threshold voltage distribution of a TLC appearing in each area.

A start position K1 used for writing the compression data CpData of the upper page is set as an MSB. The compression data CpData of the upper page is arranged from the start position K1 to the LSB side, and padding data "0" is arranged following this compression data. A start position K2 used for writing the compression data CpData of the middle page is set as an LSB. The LSB is a bit adjacent to the start position K1 toward the MSB side. The compression data CpData of the middle page is arranged from the start position K2 to the MSB side, and a padding data string "1" is arranged following this compression data. As illustrated in a third diagram from the upper side in FIG. 13, a start position K3 (third cell position) used for writing the compression data CpData of the lower page is the same as the start position K1 and is an MSB in this case. In the compression data CpData of the lower page, an arrangement starting from the MSB that is the start position K3 toward the LSB side and an arrangement starting from the LSB (fourth cell position) adjacent to the start position K3 toward the MSB side are alternately performed. In addition, in the remaining cells of the lower page, a padding data string "1" is arranged. More specifically, the data arrangement of the lower page is "10, 12, 14, ..., 1, 1, 1, 1, ..., 15, 13, 11". The start position K1 (=K3) and K2, similarly to the first and second embodiments, are changed in accordance with the write count.

As illustrated in a lower diagram in FIG. 13, in cells included in an area R1, since the middle page data is "1", the distribution E, A, D, or F appears. In cells included in an area R2, since the lower page data and the middle page data are "1", the distribution E or the distribution A appears. In cells included in an area R3, since the lower page data is "1", the distribution E, A, B, or C appears. In cells included in an area R4, since the lower page data is "1", and the upper page data is "0", the distribution A or the distribution B appears. In cells included in an area R5, since the lower page data is "0", the distribution A, B, F, or G appears. Accordingly, in the example illustrated in FIG. 13, the distribution H having a maximum threshold voltage does not appear.

In this way, regarding the upper page, similarly to the first embodiment, the upper page data is arranged from a first cell corresponding to the start position K1 to one of the LSB side and the MSB side, and the padding data is arranged following this upper page data. When the data reaches the end bit of the one side, the data is wrapped around. Regarding the middle page, similarly to the first embodiment, the middle page data is arranged from a second cell adjacent to the first cell toward the other side, and the padding data is arranged following this middle page data. When the data reaches the end bit of the other side, the data is wrapped around. Regarding the lower page, the start position K3 is set to be the same as the start position K1 of the upper page. In addition, regarding the lower page, arrangement of the lower page data from the first cell corresponding to the start position K3 (=K1) toward the one side and arrangement of the lower page data from the second cell adjacent to the first cell toward the other side are alternately performed, and the padding data is arranged in the remaining cells. Through such a padding processing for the lower page, in the area R3 including cells in which the compression data is written into both the upper page and the middle page, the padding data of the lower page is arranged.

In the description presented above, while the start position K3 of the lower page is the same as the start position K1 of the upper page, the start position K3 of the lower page may be offset from the start position K1 of the upper page. The size and the position of the area R3 are changed in accordance with the compression rate of the upper page and the compression rate of the middle page. Thus, the offset value $\Delta ofs$ is determined according to the compression rate of the upper page and the compression rate of the middle page such that the padding data of the lower page is arranged in this area R3.

The padding processing of the TLC mode may be performed by combining the padding processing described in the second embodiment and the padding processing of the lower page illustrated in FIG. 13. In other words, the padding processing described with reference to the upper diagram in FIG. 9 is applied to the upper page, the padding processing described with reference to the lower diagram in FIG. 9 is applied to the middle page, and the padding processing described with reference to the third diagram from the upper side in FIG. 13 is applied to the lower page. In this case, the upper page data is arranged from the first cell corresponding to the start position K1 toward one of the LSB side and the MSB side, and the padding data is arranged following this upper page data. When the data reaches the end bit of the one side, the data is wrapped around. Regarding the middle page, similarly to the second embodiment, the middle page data is arranged, to the one side, from the second cell adjacent to the position of the end bit of the upper page data toward the one side, and the padding data is arranged following this middle page data. When the data reaches the end bit of the one side, the data is wrapped around. Regarding the lower page, the start position K3 is set to be the same as the start position K1 of the upper page. In addition, arrangement of the lower page data from the first cell corresponding to the start position K3 (=K1) to the one side and arrangement of the lower page data from the second cell adjacent to the first cell toward the other side are alternately performed, and the padding data is arranged in the remaining cells.

In this way, according to the third embodiment, in a case where recording is performed in the TLC mode, since the compression data of each page is arranged in a distributed manner, the number of cells in which the compression data is written into all the upper page, the middle page, and the lower page is minimized, and the appearance frequency of the distribution H having the maximum threshold voltage is minimized.

Fourth Embodiment

In a fourth embodiment, a padding processing of a QLC mode (four bits/cell) will be described. In the case of the QLC mode, 16 threshold voltage distributions are included. In a case where the four bits/cell is used, one physical sector corresponds to four pages. Four bits that can be stored by each cell correspond to these four pages. In this embodiment, these four pages will be referred to as an upper page, a middle0 page, a middle1 page, and a lower page. The middle0 page is a higher-rank page of the middle1 page.

Figure 14:
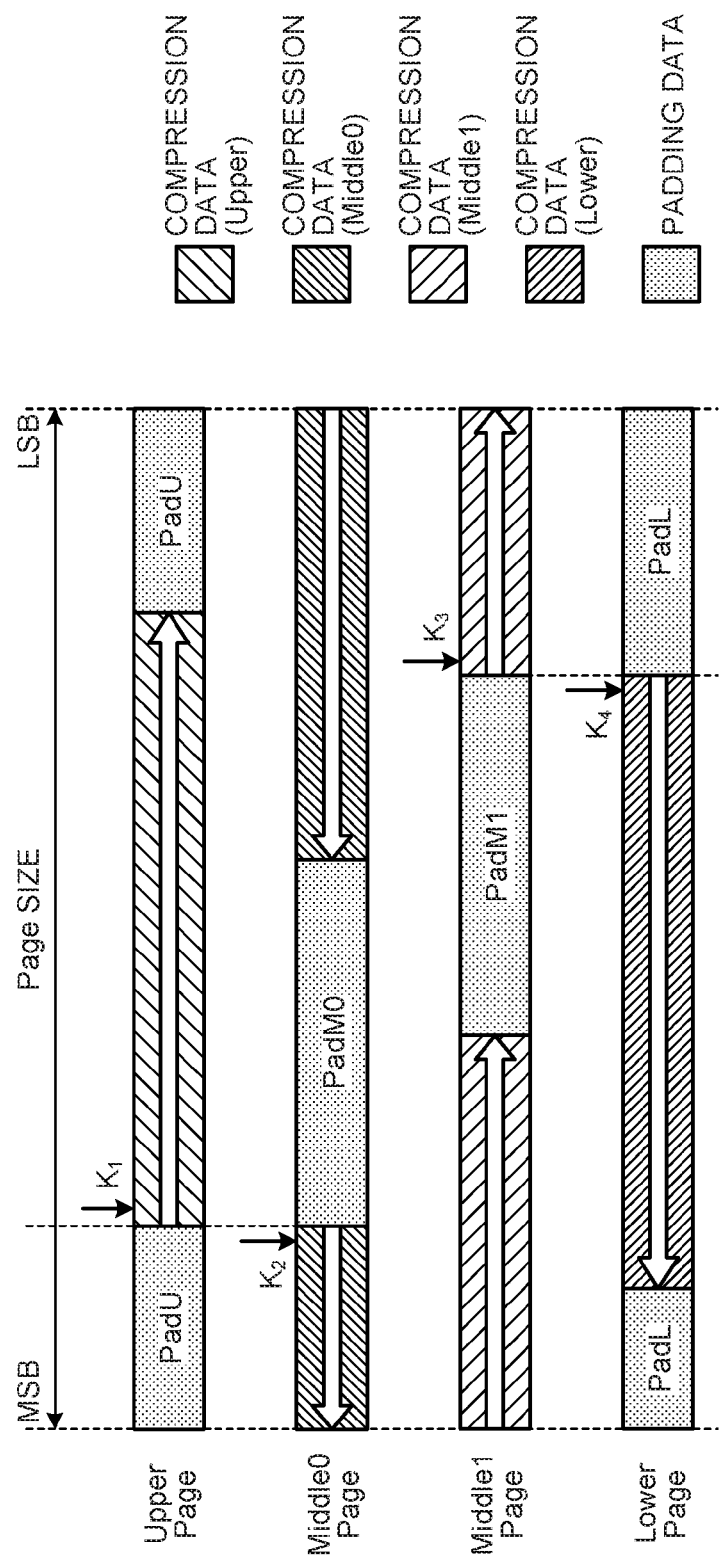
FIG. 14 is a diagram that illustrates a padding processing performed by a memory system according to a fourth embodiment.

FIG. 14 is a diagram that illustrates a padding processing according to the fourth embodiment. In the order from the upper side in FIG. 14, examples of the padding processing of an upper page, a middle0 page, a middle1 page, and a lower page are illustrated.

In the fourth embodiment, by using a combination of the padding processing for two pages described in the first embodiment, padding processing for four pages is performed. In the fourth embodiment, the upper page and the middle0 page form a pair, and the middle1 page and the lower page form a pair. Here, the combination of pairs is arbitrary, and another combination may be employed.

The compression data CpData of the upper page is arranged from the start position (first cell position) K1 to the LSB side, and a padding data string PadU is arranged following this compression data. As illustrated in the second diagram from the upper side in FIG. 14, the compression data CpData of the middle0 page is arranged from the start position K2 ((second cell position)) to the MSB side, and a padding data string PadM0 is arranged following this compression data. The start position K2 is adjacent to the start position K1 toward the MSB side.

The compression data CpData of the middle1 page is arranged from the start position K3 (fifth cell position) to the LSB side, and a padding data string PadM1 is arranged following this compression data. As illustrated in a lower diagram in FIG. 14, the compression data CpData of the lower page is arranged from the start position K4 (sixth cell position) to the MSB side, and a padding data string PadL is arranged following this compression data. The start position K4 is adjacent to the start position K3 toward the MSB side. Each of the padding data strings PadU, PadM0, PadM1, and PadL is configured by a data string of "0" or "1".

The start positions K1 and K2, similarly to the first and second embodiments, are changed according to the write count. The start position K3 is offset from the start position K1 by a value $\Delta ofs$. As the offset value $\Delta ofs$, a fixed value may be used, or a changeable value determined based on the compression rate of the upper page and the compression rate of the middle1 page may be used. In addition, the start position K3 may be acquired based on the write count. In such a case, the start position K1 is acquired by performing first calculation using the write count, and the start position K3 is acquired by performing second calculation using the write count.

In this way, according to the fourth embodiment, in a case where recording is performed in the QLC mode, since the compression data of each page is arranged in a distributed manner, the number of cells in which the compression data is written into all the upper page, the middle0 page, the middle1 page, and the lower page is minimized, and the appearance frequency of a distribution having the maximum threshold voltage is minimized.

Fifth Embodiment

Figure 15:
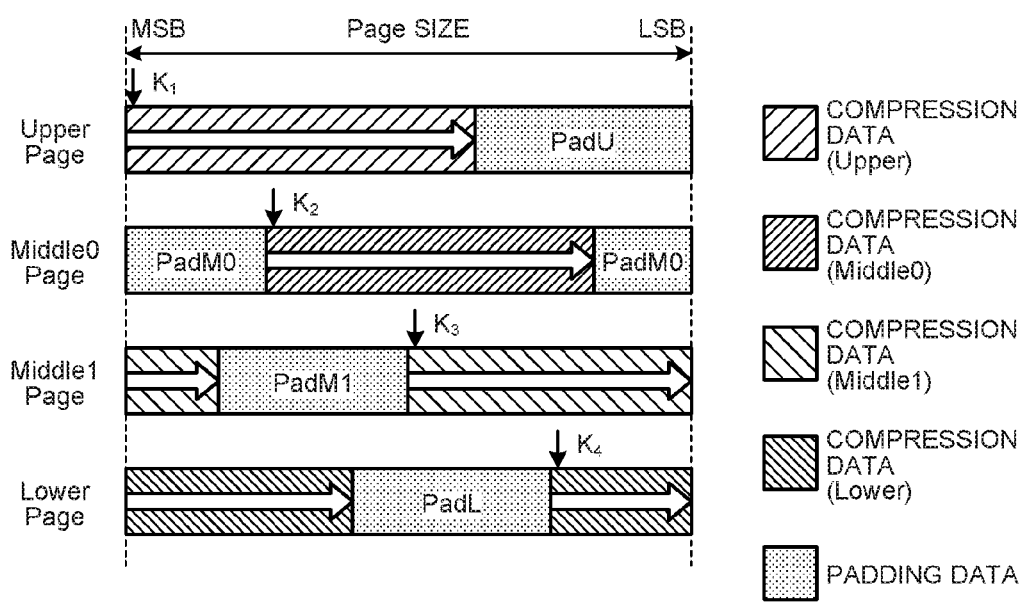
FIG. 15 is a diagram that illustrates a padding processing performed by a memory system according to a fifth embodiment.

In a fifth embodiment, another padding processing for cells of the QLC mode (four bits/cell) will be described. FIG. 15 is a diagram used for describing the padding processing according to the fifth embodiment. In the order from the upper side in FIG. 15, examples of the padding processing of an upper page, a middle0 page, a middle1 page, and a lower page are illustrated.

In the fifth embodiment, the start positions K1, K2, K3, and K4 of the pages are configured to be different from each other, and the arrangement directions of the compression data of the pages are uniformized to one of a first direction toward the MSB side and a second direction toward the LSB side.

The compression data CpData of the upper page is arranged from the start position K1 (first cell position) to the LSB side, and a padding data string PadU is arranged following this compression data. The compression data CpData of the middle0 page is arranged from the start position K2 (second cell position) to the LSB side, and a padding data string PadM0 is arranged following this compression data.

The compression data CpData of the middle1 page is arranged from the start position K3 (fifth cell position) to the LSB side, and a padding data string PadM1 is arranged following this compression data. The compression data CpData of the lower page is arranged from the start position K4 (sixth cell position) to the LSB side, and a padding data string PadL is arranged following this compression data. Each of the padding data strings PadU, PadM0, PadM1, and PadL is configured by a data string of "0" or "1".

The start position K1, similarly to the first and second embodiments, is changed according to the write count. The start positions K2, K3, and K4 are offset from the start position K1 by values $\Delta ofs2$, $\Delta ofs3$, and $\Delta ofs4$. The offset value $\Delta ofs2$ of the start position K2, for example, is a value acquired by dividing the page size M by the number N (=4) of pages included in one physical sector. The offset value $\Delta ofs3$ of the start position K3 is set as $2 \times \Delta ofs2$, and the offset value $\Delta ofs4$ of the start position K4 is set as $3 \times \Delta ofs2$. Here, the offset values $\Delta ofs2$, $\Delta ofs3$, and $\Delta ofs4$ may be controlled so as to be changed according to the compression rate of each page.

In this way, according to the fifth embodiment, in a case where recording is performed in the QLC mode, since the compression data of each page is arranged in a distributed manner, the number of cells in which the compression data is written into all the upper page, the middle0 page, the middle1 page, and the lower page is minimized, and the appearance frequency of a distribution having the maximum threshold voltage is minimized.

In addition, the present invention may be applied to a nonvolatile memory that performs a recording operation of five bits/cell or more. In a case where pages of an odd number (five pages, seven pages, . . . ) are allocated to one physical sector, the technical idea of the third embodiment and the technical idea of the fourth or fifth embodiment may be combined. On the other hand, in a case where pages of an even number (six pages, eight pages, . . . ) are allocated to one physical sector, the technical idea of the fourth embodiment or the technical idea of the fifth embodiment may be employed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory controller that controls a nonvolatile memory including a plurality of physical sectors, each of the physical sectors including memory cells, each of the memory cells being capable of storing data of m bits using threshold voltage distributions of the m-th power of two, each of the physical sectors storing data of m pages, m being a natural number of two or more, the memory controller comprising:

a compression unit that compresses first data to be written into a first page and second data to be written into a second page, the first page and the second page being one of the m pages allocated to a first physical sector;

a padding processing unit that performs a first padding processing and a second padding processing, the first padding processing generating first recording data such that the compressed first data is written into first memory cells, and first padding data is written into second memory cells, the first memory cells being memory cells arrayed from a first cell position of the first physical sector in a first direction so as to be wrappable around, the second memory cells being memory cells excluding the first memory cells among the memory cells included in the first physical sector, the second padding processing generating second recording data such that the compressed second data is written into third memory cells, and second padding data is written into fourth memory cells, the third memory cells being a plurality of memory cells arrayed from a second cell position of the first physical sector in a second direction so as to be wrappable around, and the fourth memory cells being memory cells excluding the third memory cells among the memory cells included in the first physical sector, the second cell position being adjacent to the first cell position in the second direction, the second direction being different from the first direction; and an output unit that writes the first recording data into the first page and writes the second recording data into the second page.

2. The memory controller according to claim 1, wherein the padding processing unit generates the first recording data such that the compressed first data is arranged from the first cell position in the first direction and generates the second recording data such that the compressed second data is arranged from the second cell position in the second direction.

3. The memory controller according to claim 2, further comprising:

an input unit that reads data from the nonvolatile memory; and a decompression unit that restores the first data by decompressing data read from the first page from the first cell position toward the first direction and restores the second data by decompressing data read from the second page from the second cell position toward the second direction.

4. The memory controller according to claim 1, wherein the first padding data and the second padding data are data that is not coded in a maximum threshold voltage distribution among the threshold voltage distributions of the m-th power of two.

5. The memory controller according to claim 1, wherein the padding processing unit changes the first cell position and the second cell position in accordance with a number of times of writing or a number of times of erasing of the first physical sector.

6. The memory controller according to claim 1, wherein m is two.

7. The memory controller according to claim 1,
wherein m is three,
wherein the compression unit compresses third data to be written into a third page, the third page being one page among the m pages allocated to the first physical sector,
wherein the padding processing unit performs a third padding processing, the third padding processing generating third recording data such that the compressed third data is written into fifth memory cells, and third padding data is written into sixth memory cells, the fifth memory cells including memory cells arrayed so as to be wrappable around in a third direction from a third cell position of the first physical sector and memory cells arrayed so as to be wrappable around in a fourth direction from a fourth cell position that is adjacent to the third cell position in the second direction, and the sixth memory cells being memory cells excluding the fifth memory cells among the memory cells included in the first physical sector, and
wherein the output unit writes the third recording data into the third page.

8. The memory controller according to claim 7, wherein the padding processing unit
generates the first recording data such that the compressed first data is arranged from the first cell position in the first direction,
generates the second recording data such that the compressed second data is arranged from the second cell position in the second direction, and
generates the third recording data such that the compressed third data is arranged from the third and fourth cell positions in the third direction and the fourth direction.

9. The memory controller according to claim 8,
wherein the third direction coincides with the first direction, and the fourth direction coincides with the second direction.

10. The memory controller according to claim 9, wherein the third cell position coincides with the first cell position.

11. The memory controller according to claim 9, wherein the third cell position is offset from the first cell position by a first offset value, the first offset value being determined in accordance with compression rates of the first page and the second page.

12. A memory controller that controls a nonvolatile memory including a plurality of physical sectors, each of the physical sectors including memory cells, each of the memory cells being capable of storing data of m bits using threshold voltage distributions of the m-th power of two, each of the physical sectors storing data of m pages, m being three, the memory controller comprising:
a compression unit that compresses first data to be written into a first page, second data to be written into a second page, and third data to be written into a third page, the first page, the second page, and the third page being one of the m pages allocated to a first physical sector;
a padding processing unit that performs a first padding processing, a second padding processing, and a third padding processing, the first padding processing generating first recording data such that the compressed first data is written into first memory cells, and first padding data is written into second memory cells, the first memory cells being memory cells arrayed from a first cell position of the first physical sector in a first direction so as to be wrappable around, the second memory cells being memory cells excluding the first memory cells among the memory cells included in the first physical sector, the second padding processing generating second recording data such that the compressed second data is written into third memory cells, and second padding data is written into fourth memory cells, the third memory cells being a plurality of memory cells arrayed from a second cell position of the first physical sector in a second direction so as to be wrappable around, and the fourth memory cells being memory cells excluding the third memory cells among the memory cells included in the first physical sector, the third padding processing generating third recording data such that the compressed third data is written into fifth memory cells, and third padding data is written into sixth memory cells, the fifth memory cells including memory cells arrayed so as to be wrappable around in a third direction from a third cell position of the first physical sector and memory cells arrayed so as to be wrappable around in a fourth direction from a fourth cell position that is adjacent to the third cell position in the second direction, and the sixth memory cells being memory cells excluding the fifth memory cells among the memory cells included in the first physical sector, the second cell position being adjacent to a memory cell into which last data of the compressed first data is written in the first direction, the second direction coinciding with the first direction, the third cell position being offset from the first cell position by a first offset value, the first offset value being determined in accordance with compression rates of the first page and the second page; and
an output unit that writes the first recording data into the first page, writes the second recording data into the second page, and writes the third recording data into the third page.

13. The memory controller according to claim 1,
wherein m is four,
wherein the compression unit compresses third data to be written into a third page and fourth data to be written into a fourth page, the third page and the fourth page being one page of the m pages allocated to a first physical sector,
wherein the padding processing unit performs a third padding processing and a fourth padding processing, the third padding processing generating third recording data such that the compressed third data is written into seventh memory cells, and third padding data is written into eighth memory cells, the seventh memory cells being memory cells arrayed from a fifth cell position of the first physical sector in a fifth direction so as to be wrappable around, the eighth memory cells being memory cells excluding the seventh memory cells among the memory cells included in the first physical sector, and the fourth padding processing generating fourth recording data such that the compressed fourth data is written into ninth memory cells and fourth padding data is written into tenth memory cells, the ninth memory cells being memory cells arrayed from a sixth cell position of the first physical sector in a sixth direction so as to be wrappable around, the tenth memory cells being memory cells excluding the ninth memory cells among the memory cells included in the first physical sector, and wherein the output unit writes the third recording data into the third page and writes the fourth recording data into the fourth page.

14. The memory controller according to claim 13, wherein the sixth cell position is adjacent to the fifth cell position in the second direction, wherein the fifth direction coincides with the first direction, and the sixth direction coincides with the second direction, and wherein the fifth cell position is offset from the first cell position by a second offset value.

15. A method of controlling a nonvolatile memory for controlling the nonvolatile memory including a plurality of physical sectors, each of the physical sectors including memory cells, each of the memory cells being capable of storing data of m bits using threshold voltage distributions of the m-th power of two, each of the physical sectors storing data of m pages, m being a natural number of two or more, the method comprising:

compressing first data to be written into a first page and second data to be written into a second page, the first page and the second page being one of the m pages allocated to a first physical sector;

performing a first padding processing and a second padding processing, the first padding processing generating first recording data such that the compressed first data is written into first memory cells, and first padding data is written into second memory cells, the first memory cells being memory cells arrayed from a first cell position of the first physical sector in a first direction so as to be wrappable around, the second memory cells being memory cells excluding the first memory cells among the memory cells included in the first physical sector, the second padding processing generating second recording data such that the compressed second data is written into third memory cells, and second padding data is written into fourth memory cells, the third memory cells being a plurality of memory cells arrayed from a second cell position of the first physical sector in a second direction so as to be wrappable around, and the fourth memory cells being memory cells excluding the third memory cells among the memory cells included in the first physical sector, the second cell position being adjacent to the first cell position in the second direction, the second direction being different from the first direction; and writing the first recording data into the first page and writing the second recording data into the second page.

16. A memory system comprising:

a nonvolatile memory including a plurality of physical sectors, each of the physical sectors including memory cells, each of the memory cells being capable of storing data of m bits using threshold voltage distributions of the m-th power of two, each of the physical sectors storing data of m pages, m being a natural number of two or more; and a memory controller that includes:

a compression unit that compresses first data to be written into a first page and second data to be written into a second page, the first page and the second page being one of the m pages allocated to a first physical sector;

a padding processing unit that performs a first padding processing and a second padding processing, the first padding processing generating first recording data such that the compressed first data is written into first memory cells, and first padding data is written into second memory cells, the first memory cells being memory cells arrayed from a first cell position of the first physical sector in a first direction so as to be wrappable around, the second memory cells being memory cells excluding the first memory cells among the memory cells included in the first physical sector, the second padding processing generating second recording data such that the compressed second data is written into third memory cells, and second padding data is written into fourth memory cells, the third memory cells being a plurality of memory cells arrayed from a second cell position of the first physical sector in a second direction so as to be wrappable around, and the fourth memory cells being memory cells excluding the third memory cells among the memory cells included in the first physical sector, the second cell position being adjacent to the first cell position in the second direction, the second direction being different from the first direction; and an output unit that writes the first recording data into the first page and writes the second recording data into the second page.

17. The memory controller according to claim 12, wherein the padding processing unit generates the first recording data such that the compressed first data is arranged from the first cell position in the first direction, generates the second recording data such that the compressed second data is arranged from the second cell position in the second direction, and generates the third recording data such that the compressed third data is arranged from the third and fourth cell positions in the third direction and the fourth direction.

* * * * *